(12) United States Patent
Shimizu et al.

(10) Patent No.: US 7,154,775 B2
(45) Date of Patent: Dec. 26, 2006

(54) MAGNETIC RANDOM ACCESS MEMORY (75) Inventors: Yuui Shimizu, Yokohama (JP); Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 551 days.

(21) Appl. No.: 10/614,814

(22) Filed: Jul. 9, 2003

(65) Prior Publication Data

US 2005/0270887 A1 Dec. 8, 2005

(30) Foreign Application Priority Data

Jul. 10, 2002 (JP) .............................. 2002-201128

(51) Int. Cl.
*G11C 11/14* (2006.01)
(52) U.S. Cl. ...................... 365/171; 365/158
(58) Field of Classification Search ................ 365/171
See application file for complete search history.

(56) References Cited

U.S. PATENT DOCUMENTS 6,341,084 B1 * 1/2002 Numata et al. ............. 365/158

FOREIGN PATENT DOCUMENTS

| JP | 8-297968 | 11/1996 |
|---|---|---|
| JP | 10-199233 | 7/1998 |
| JP | 2001-148189 | 5/2001 |
| JP | 2001-325791 | 11/2001 |
| JP | 2002-100181 | 4/2002 |
| JP | 2002-216467 | 8/2002 |

* cited by examiner

*Primary Examiner*—Thong Q. Le
(74) *Attorney, Agent, or Firm*—Oblon, Spivak, McClelland, Maier & Neustadt, P.C.

(57) ABSTRACT

A magnetic random access memory includes a memory cell array in which memory cells, each having a magnetoresistive element as a storage element, are arranged, word lines respectively connected to rows of the memory cell array, bit lines respectively connected to columns of the memory cell array, row decoders to select the word lines, and a column decoder to select the bit lines. To determine the value of storage data, electrical characteristic values based on storage data stored in the plurality of memory cells are detected, reference data is continuously written in the plurality of memory cells, the reference data written in the plurality of memory cells is continuously read out to detect electrical characteristic values based on the reference data, and the electrical characteristic values based on the storage data are compared with those based on the reference data.

31 Claims, 9 Drawing Sheets

MAGNETIC RANDOM ACCESS MEMORY

CROSS-REFERENCE TO RELATED APPLICATIONS

This application is based upon and claims the benefit of priority from the prior Japanese Patent Application No. 2002-201128, filed Jul. 10, 2002, the entire contents of which are incorporated herein by reference.

BACKGROUND OF THE INVENTION

1. Field of the Invention

The present invention relates to a magnetic random access memory (MRAM) which is a nonvolatile memory using a magnetoresistive effect and a driving method thereof and, more particularly, to a write/read sequence thereof.

2. Description of the Related Art

An MRAM is a device which performs memory operation by storing units of binary information "1" and "0", using a magnetoresistive effect. The MRAM has high potential such as nonvolatility, high integration, high durability, and high-speed operation. For this reason, the MRAM that can replace an existing device such as a conventional DRAM or EEPROM is expected as an ideal device.

A typical example of the MRAM uses an MTJ (Magnetic Tunnel Junction) element that includes a multilayered film formed of metal magnetic bodies and an insulating body and utilizes a magnetoresistive change by a spin polarization tunneling effect in the multilayered film. Several memory cells have been proposed as MRAMs, which typically include a structure having a transistor inserted in series into one MTJ element to ensure a cell selectivity (ISSCC 2000TA7.2, ISSCC 2000TA7.3) (FIG. 19) and a cross-point structure (FIG. 20).

An MTJ element has a structure formed by sandwiching an insulating film by two magnetic films having conductivity. Two states are created depending on whether the spin directions in the two magnetic films that sandwich the insulating film are parallel or anti-parallel. More specifically, when the two magnetic films have the same magnetization direction, the magnitude of a tunneling current that flows through the insulating film is larger than that of a current that flows when the two magnetic films have reverse magnetization directions. In other words, when the two magnetic films have reverse magnetization directions, the resistance value between the two magnetic films having conductivity can be made larger than that when the two magnetic films have the same magnetization direction. For this reason, it is preferable for reading a signal to make the difference in resistance value as large as possible. In reading information from a memory cell, a current that flows in the two magnetic films through the insulating film is detected, or the current value is converted into a voltage and then the voltage is detected.

In writing information in a memory cell, one of the two magnetic films normally has a fixed magnetization direction and therefore is not influenced by the external magnetic field. The magnetic film whose magnetization direction is fixed is called a pinned layer. The other magnetic film has the same magnetization direction as that of the pinned layer or a magnetization direction reverse to that of the pinned layer depending on the applied magnetic field. The magnetic film whose magnetization direction can change is called a free layer.

The magnetization direction of the free layer is changed by a magnetic field generated by a current that flows to a bit line and write word line, which pass through each memory cell. At this time, a current having a half of the current amount necessary for a change in magnetization direction is supplied to each of the bit line and word line. Accordingly, any unselected memory cell is prevented from being rewritten (U.S. Pat. No. 6,081,445).

When information is to be read out from an MRAM memory cell, a voltage as low as several hundred mV is applied to the memory cell, and a current that accordingly flows is detected. If the voltage applied to the memory cell is too high, no sufficient MR (MagnetoResistance) ratio can be obtained. Hence, the voltage to be applied cannot be raised more than necessity.

On the other hand, when information in a memory cell is to be rewritten, a relatively large current of several ten mA or several mA must be supplied to the bit line and write word line to generate a magnetic field necessary for the rewrite. For this reason, an IR drop (voltage drop) occurs in the chip due to this operation. The power supply line and ground line in the chip may receive disturbance for a predetermined time.

Hence, to prevent any error in reading after a write for a memory cell, operation must be started after the variation in power supply line and ground line converges to some extent. For this reason, if operation is executed in, e.g., a repetitive write/read sequence for a write, read, write, read, . . . , a standby time must be inserted before every read, resulting in a low efficiency.

In consideration of the above problem in the prior art, it is preferable for a magnetic random access memory and a driving method thereof to optimize a sequence including a write and read for a memory cell, thereby totally shortening the necessary operation time.

BRIEF SUMMARY OF THE INVENTION

According to a first aspect of the present invention, there is provided a magnetic random access memory comprising:

a memory cell array in which memory cells, each having a magnetoresistive element as a storage element, are arranged in correspondence with addresses that are arranged in a matrix format;

word lines respectively connected to rows of the memory cell array;

bit lines respectively connected to columns of the memory cell array;

a row decoder to select the word lines; and a column decoder to select the bit lines, wherein electrical characteristic values based on storage data stored in a plurality of memory cells are detected, reference data is continuously written in the plurality of memory cells, the reference data written in the plurality of memory cells is continuously read out to detect electrical characteristic values based on the reference data, and the electrical characteristic values based on the storage data are compared with those based on the reference data to determine values of the storage data.

According to a second aspect of the present invention, there is provided a driving method of a magnetic random access memory which comprises a memory cell array in which memory cells, each having a magnetoresistive element as a storage element, are arranged in correspondence with addresses that are arranged in a matrix format, word lines respectively connected to rows of the memory cell array, bit lines respectively connected to columns of the memory cell array, a row decoder to select the word lines, and a column decoder to select the bit lines, the method comprising:

detecting electrical characteristic values based on storage data stored in a plurality of memory cells;

continuously writing reference data in the plurality of memory cells;

continuously reading out the reference data written in the plurality of memory cells to detect electrical characteristic values based on the reference data; and comparing the electrical characteristic values based on the storage data with those based on the reference data to determine values of the storage data.

According to a third aspect of the present invention, there is provided a magnetic random access memory comprising:

a memory cell array in which memory cells, each having a magnetoresistive element as a storage element, are arranged in correspondence with addresses that are arranged in a matrix format;

word lines respectively connected to rows of the memory cell array;

bit lines respectively connected to columns of the memory cell array;

a row decoder to select the word lines;

a column decoder to select the bit lines;

a first buffer to store detected electrical characteristic values based on storage data stored in a plurality of memory cells;

a second buffer to store continuously detected electrical characteristic values based on reference data written in the plurality of memory cells; and a comparator to compare the electrical characteristic values based on the storage data with those based on the reference data to determine values of the storage data.

DETAILED DESCRIPTION OF THE INVENTION

The embodiments of the present invention will be described below with reference to the accompanying drawing. In the following description, the same reference numerals denote the constituent elements having almost the same functions and arrangements, and a repetitive description will be done only if necessary.

Figure 19:
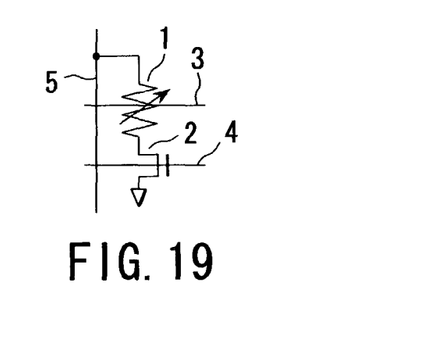
FIG. 19 is a view showing an example of the typical structure of an MRAM memory cell that can be commonly used for the embodiments.
Figure 20:
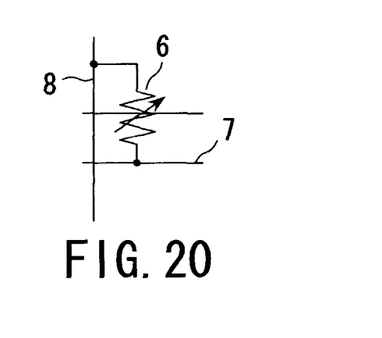
FIG. 20 is a view showing another example of the typical structure of the MRAM memory cell that can be commonly used for the embodiments.

FIGS. 19 and 20 are views showing different examples of the typical structure of an MRAM memory cell that can be commonly used for the following embodiments.

In an MRAM memory cell shown in FIG. 19, a select n-transistor 2 is connected in series with one MTJ element 1. In addition, a write word line 3 is arranged in addition to a word line 4 and bit line 5, as shown in FIG. 19.

On the other hand, an MRAM memory cell shown in FIG. 20 has a cross-point structure. In this case, one MTJ element 6 is arranged at each intersection of a word line 7 and bit line 8 to be sandwiched there-between.

(First Embodiment)

Figure 1:
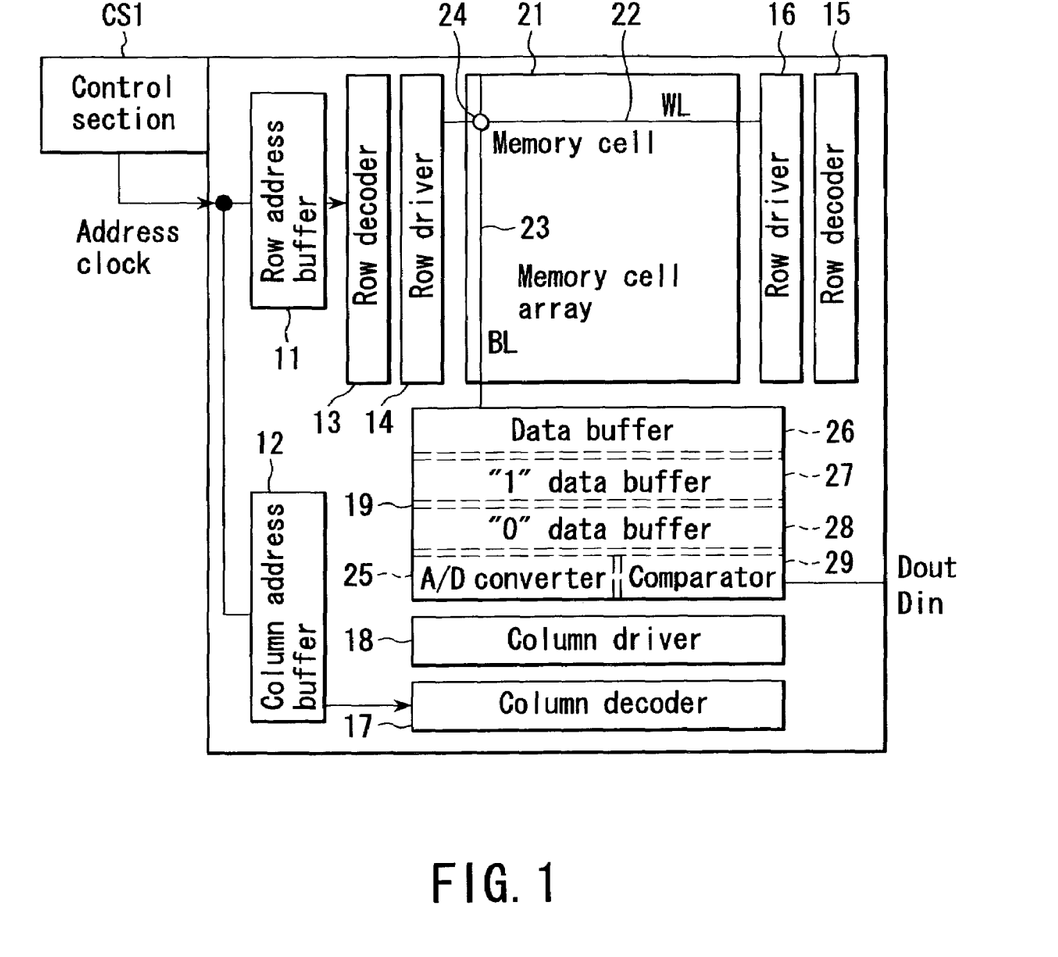
FIG. 1 is a block diagram showing an MRAM according to a first embodiment of the present invention.

FIG. 1 is a block diagram showing an MRAM according to the first embodiment of the present invention. This MRAM has a synchronous memory chip structure.

This MRAM has a memory cell array 21 in which memory cells 24 each having a magnetoresistive element as a storage element are arranged in correspondence with addresses that are arranged in a matrix format. Word lines 22 are respectively connected to the rows of the memory cell array 21. Bit lines 23 are respectively connected to the columns of the memory cell array 21. To select the word lines 22, a row address buffer 11, row decoders 13 and 15, and row drivers 14 and 16 are arranged. To select the bit lines 23, a column address buffer 12, column decoder 17, and column driver 18 are arranged. A sense circuit 19 which reads out storage data by self-reference in a form to be described later is connected to the bit lines 23. The sense circuit 19 includes an A/D converter 25, data buffer 26, "1" data buffer 27, "0" data buffer 28, and comparator 29.

The row address buffer 11 and column address buffer 12 are connected to a control section CS1 which generates an address signal, data signal, and the like. The control section CS1 may be disposed on the same substrate as that of the memory cell array 21 and the like, or may be formed as an element separated from the memory cell array 21 and the like. The address signal from the control section CS1 is temporarily latched by the row address buffer 11 and column address buffer 12. In a read mode, the row decoder 13 and column decoder 17 respectively select a row and column on the basis of the latched address signal. In a write mode, a current is supplied from the column driver 18 to the bit line 23 corresponding to the address of the target memory cell 24. At the same time, a current corresponding to information to be written is supplied from the left and right row drivers 14 and 16 to the word line 22 corresponding to the address of the target memory cell 24.

Figure 2:
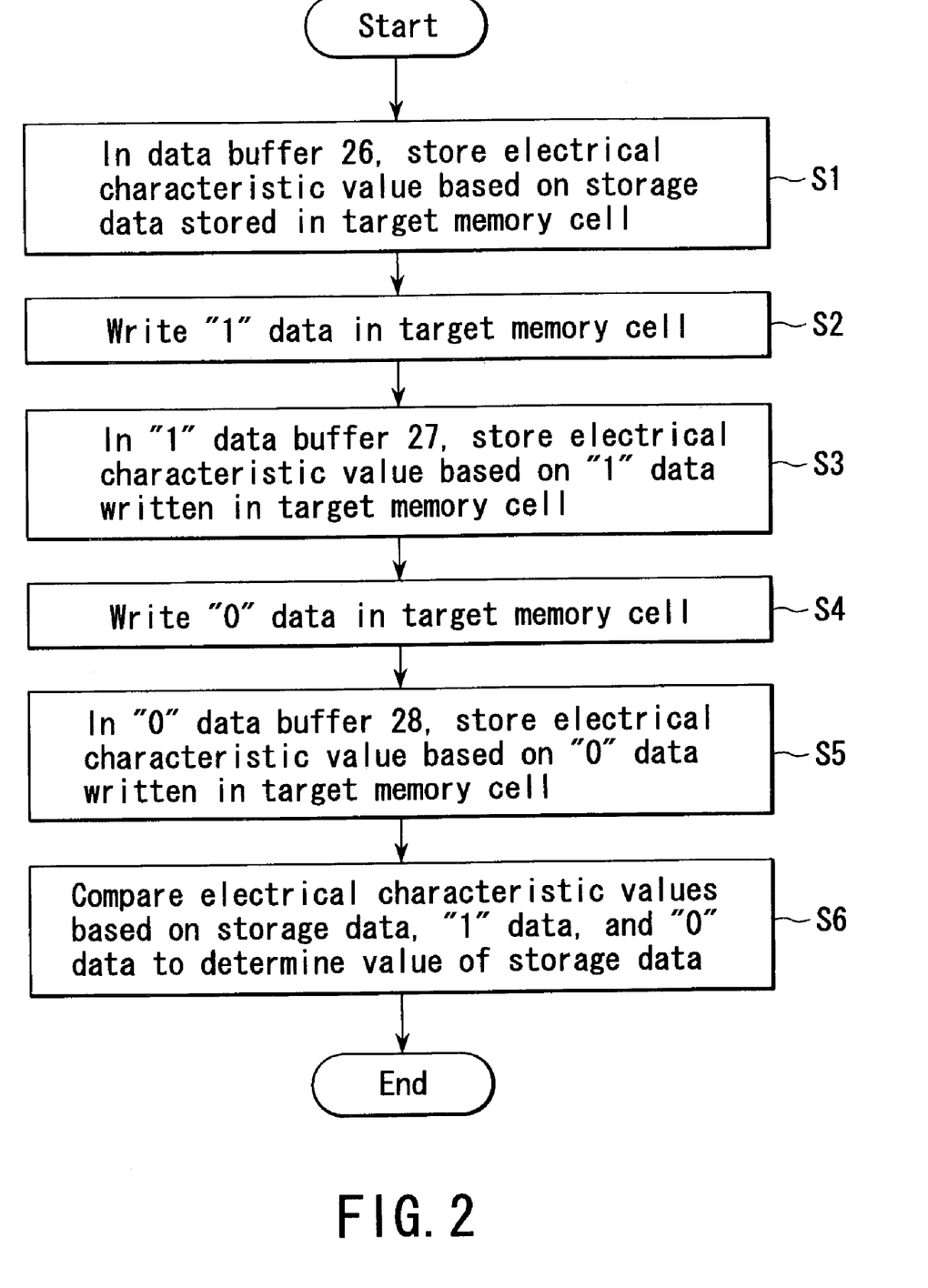
FIG. 2 is a flow chart showing a flow in reading storage data by self-reference.

In the MRAM according to this embodiment, a read by self-reference is employed as a method of reading out storage data. FIG. 2 is a flow chart showing a flow in reading storage data by self-reference.

First, an electrical characteristic value based on storage data stored in the target memory cell 24 located at the address to be read-accessed is detected and stored in the data buffer 26 (step S1). Next, "1" data is written in the target memory cell 24 (step S2). Next, the "1" data written in the target memory cell 24 is read out, and an electrical characteristic value based on the "1" data is detected and stored in the "1" data buffer 27 (step S3).

Next, "0" data is written in the target memory cell 24 (step S4). Next, the "0" data written in the target memory cell 24 is read out, and an electrical characteristic value based on the "0" data is detected and stored in the "0" data buffer 28 (step S5). Finally, the electrical characteristic value based on the storage data stored in the data buffer 26 is compared with those based on the "1" data stored in the "1" data buffer 27 and the "0" data stored in the "0" data buffer 28, thereby determining the value of the storage data (step S6).

More specifically, an electrical characteristic value based on data is based on the resistance value of the magnetoresistive element of the memory cell 24. A resistance value based on data is A/D-converted, and the digital value is stored in the data buffer 26, 27, or 28.

To read storage data by self-reference, it suffices that an electrical characteristic value based on one of "1" data and "0" data is used as reference data. When the electrical characteristic value based on the reference data is compared with that based on storage data, it can be determined whether the value of the storage data is "1" or "0". That is, in the above flow, one of the set of steps S2 and S3 and the set of steps S4 and S5 can be omitted.

Figure 3:
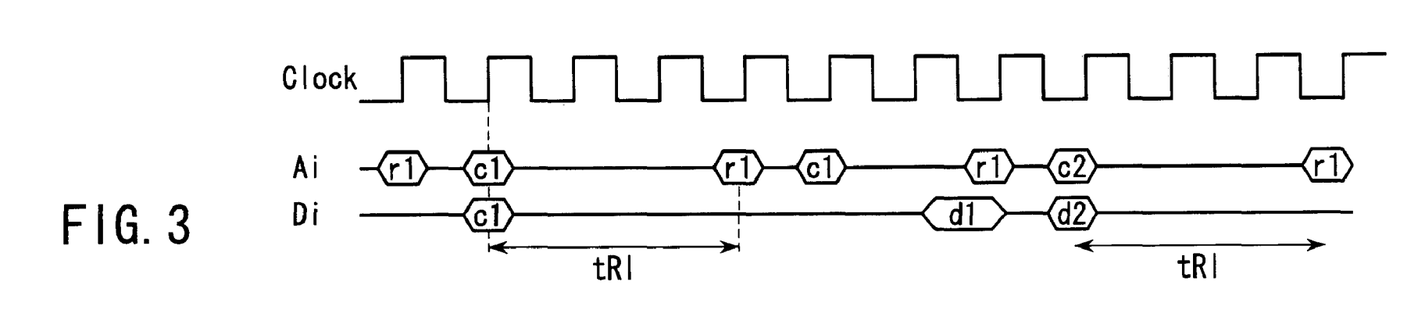
FIG. 3 is a timing chart showing an MRAM driving method according to a comparative example of the first embodiment.
Figure 4:
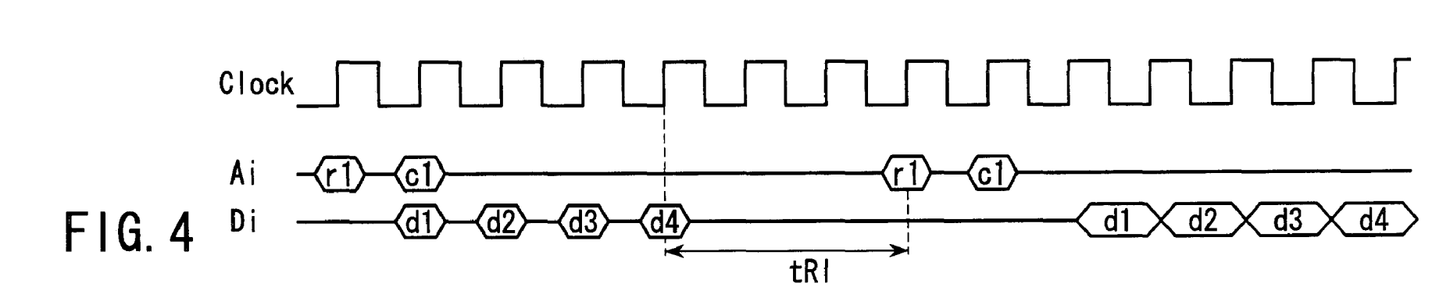
FIG. 4 is a timing chart showing an MRAM driving method according to the first embodiment.
Figures 5A, 5B:
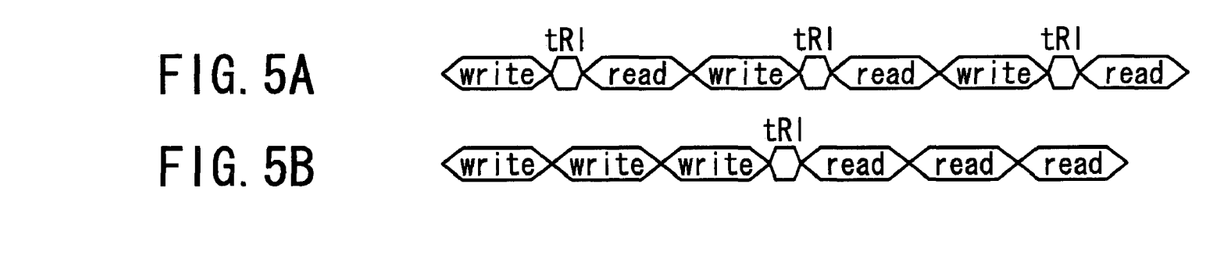
FIGS. 5A and 5B are views showing simplified operation sequences of the driving methods shown in FIGS. 3 and 4, respectively.

FIG. 3 is a timing chart showing an MRAM driving method according to a comparative example of the first embodiment. FIG. 4 is a timing chart showing an MRAM driving method according to the first embodiment. As shown in FIGS. 3 and 4, in these driving methods, a data read/write is executed in synchronism with an external clock. FIGS. 5A and 5B are views showing simplified operation sequences of the driving methods shown in FIGS. 3 and 4, respectively. Referring to FIGS. 3 to 5B, tRI represents a read inhibit time. The read inhibit time (tRI) is inserted to avoid any read error due to the influence of disturbance in the power supply line and ground line by the write current when the read is executed after the write.

In the driving method of the comparative example shown in FIG. 3, storage data is read out by self-reference for every bit. In this case, the read inhibit time (tRI) must be inserted before the read of each reference data ("1" data or "0" data serving as the reference of self-reference).

To the contrary, in the driving method according to the first embodiment shown in FIG. 4, the read of storage data is done by self-reference for a block of a plurality of (in this case, four) bits. That is, in this case, units of information corresponding to a plurality of addresses are continuously processed as a block. With this arrangement, the number of times of insertion of read inhibit time (tRI) can be decreased, and the time necessary for the read operation can totally be shortened. The addresses of memory cells to be continuously processed as a block may be addresses having consecutive numbers, as shown in FIG. 4, or addresses having inconsecutive numbers.

The driving method shown in FIG. 4 will be described next in accordance with the flow shown in FIG. 2. First, electrical characteristic values based on storage data stored in a plurality of memory cells are detected (step S1). Next, reference data is continuously written in the plurality of memory cells (step S2 and/or step S4). Next, the reference data written in the plurality of memory cells is continuously read out, and electrical characteristic values based on the reference data are detected (step S3 and/or step S5). Next, the electrical characteristic values based on the storage data are compared with those based on the reference data to determine the values of the storage data (step S6).

(Second Embodiment)

Figure 6:
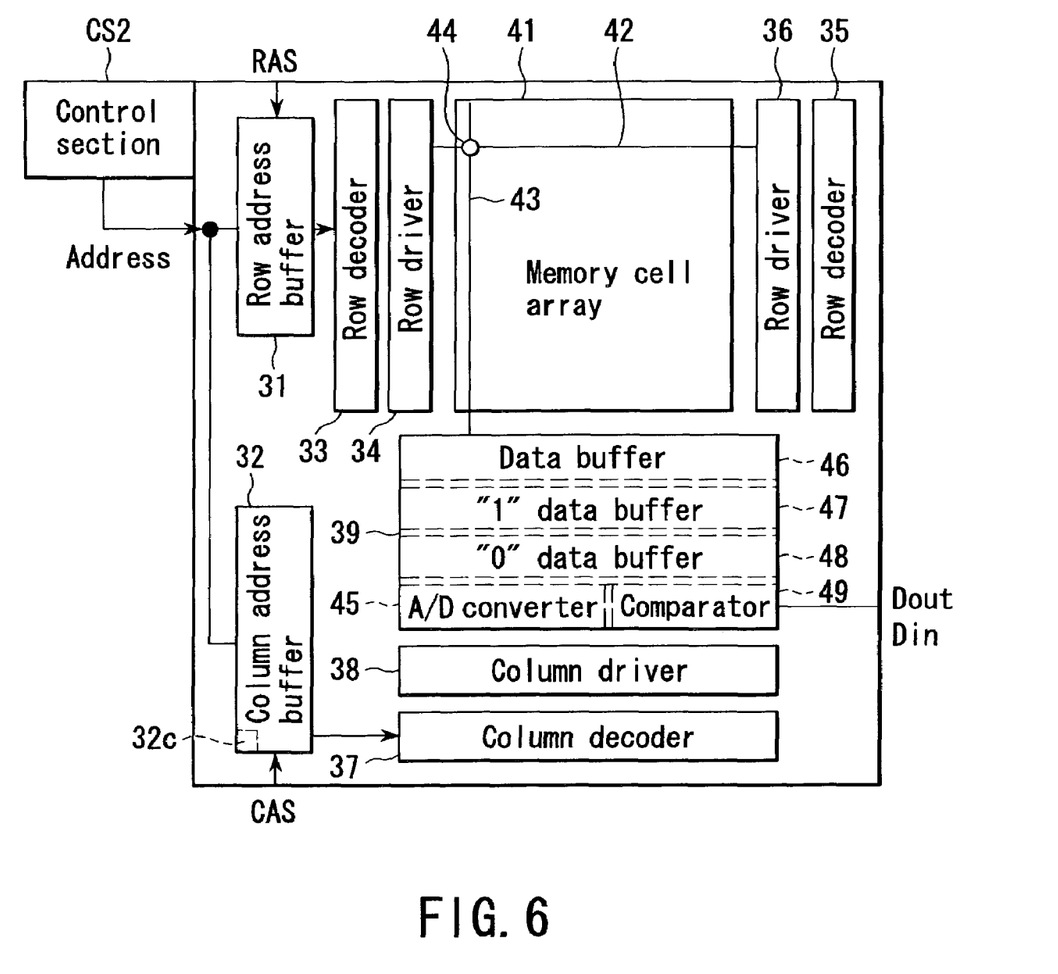
FIG. 6 is a block diagram showing an MRAM according to a second embodiment of the present invention.

FIG. 6 is a block diagram showing an MRAM according to the second embodiment of the present invention. This MRAM has an asynchronous memory chip structure.

This MRAM has a memory cell array 41 in which memory cells 44 each having a magnetoresistive element as a storage element are arranged in correspondence with addresses that are arranged in a matrix format. Word lines 42 are respectively connected to the rows of the memory cell array 41. Bit lines 43 are respectively connected to the columns of the memory cell array 41. To select the word lines 42, a row address buffer 31, row decoders 33 and 35, and row drivers 34 and 36 are arranged. To select the bit lines 43, a column address buffer 32, column decoder 37, and column driver 38 are arranged. A sense circuit 39 which reads out storage data by self-reference is connected to the bit lines 43. The sense circuit 39 includes an A/D converter 45, data buffer 46, "1" data buffer 47, "0" data buffer 48, and comparator 49.

The row address buffer 31 and column address buffer 32 are connected to a control section CS2 which generates a RAS (Row Address Strobe) signal, CAS (Column Address Strobe) signal, address signal, data signal, and the like. The control section CS2 may be disposed on the same substrate as that of the memory cell array 41 and the like, or may be formed as an element separated from the memory cell array 41 and the like. The address signal from the control section CS2 is latched by the row address buffer 31 in accordance with the RAS signal and also latched by the column address buffer 32 in accordance with the CAS signal. In a read mode, the row decoder 33 and column decoder 37 respectively select a row and column on the basis of the latched address signal. In a write mode, a current is supplied from the column driver 38 to the bit line 43 corresponding to the address of the target memory cell 44. At the same time, a current corresponding to information to be written is supplied from the left and right row drivers 34 and 36 to the word line 42 corresponding to the address of the target memory cell 44.

Figure 7:
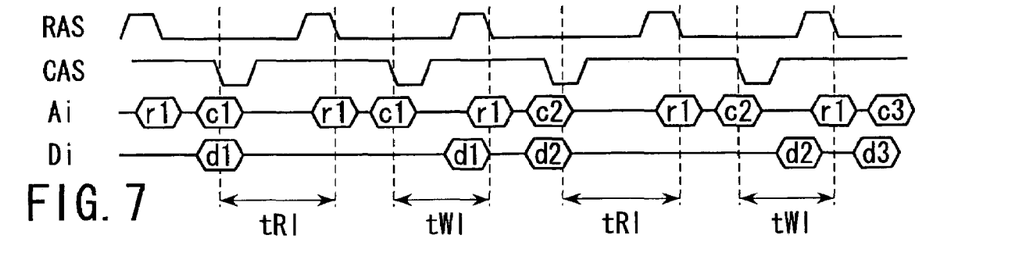
FIG. 7 is a timing chart showing an MRAM driving method according to a comparative example of the second embodiment.
Figure 8:
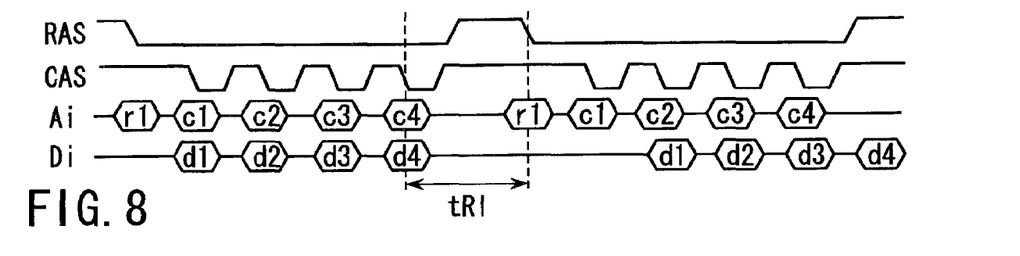
FIG. 8 is a timing chart showing an MRAM driving method according to the second embodiment.

Even in the MRAM according to this embodiment, a read by self-reference shown in FIG. 2 is employed as a method of reading out storage data. FIG. 7 is a timing chart showing an MRAM driving method according to a comparative example of the second embodiment. FIG. 8 is a timing chart showing an MRAM driving method according to the second embodiment. As shown in FIGS. 7 and 8, in these driving methods, a data read/write is executed asynchronously to an external clock. Referring to FIGS. 7 and 8, tRI represents a read inhibit time, and tWI represents a write inhibit time. The read inhibit time (tRI) is inserted due to the above-described reason. The write inhibit time (tWI) is inserted to avoid any read error due to the influence of disturbance in the power supply line and ground line by the write current when the write is executed after the read.

In the driving method of the comparative example shown in FIG. 7, storage data is read out by self-reference for every bit. In this case, the read inhibit time (tRI) must be inserted before the read of each reference data ("1" data or "0" data serving as the reference of self-reference). In addition, the write inhibit time (tWI) must be inserted before the write of each reference data.

To the contrary, in the driving method according to the second embodiment shown in FIG. 8, the read of storage data is done by self-reference for a block of a plurality of (in this case, four) bits on the same word line. That is, in this case, units of information corresponding to a plurality of addresses are continuously processed as a block. With this arrangement, the number of times of insertion of read inhibit time (tRI) and write inhibit time (tWI) can be decreased, and the time necessary for the read operation can totally be shortened.

More specifically, in the write/read of each reference data ("1" data or "0" data serving as the reference of self-reference), which is executed while the RAS signal is kept at low level, each of the column addresses is received by the column address buffer 32 at each of continuous falling edges of the CAS signal. The addresses of memory cells to be continuously processed as a block may be addresses having consecutive numbers, as shown in FIG. 8, or addresses having inconsecutive numbers.

(Third Embodiment)

Figure 9:
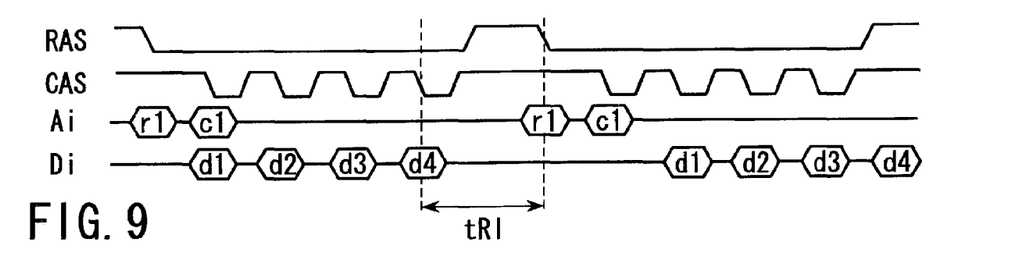
FIG. 9 is a timing chart showing an MRAM driving method according to a third embodiment of the present invention.

A block diagram representing an MRAM according to the third embodiment of the present invention is the same as that shown in FIG. 6 except a column address buffer 32 has a counter 32c which increments (increases) the column address number, as indicated by a broken line in FIG. 6. Even in the MRAM according to this embodiment, a read by self-reference shown in FIG. 2 is employed as a method of reading out storage data. FIG. 9 is a timing chart showing an MRAM driving method according to the third embodiment. As shown in FIG. 9, also in this driving method, a data read/write is executed asynchronously to an external clock.

In the driving method according to the third embodiment shown in FIG. 9, the read of storage data is done by self-reference for a block of a plurality of (in this case, four) bits consecutively arranged on the same word line. That is, in this case, units of information corresponding to a plurality of addresses having consecutive numbers are continuously processed as a block. With this arrangement, the number of times of insertion of read inhibit time (tRI) and write inhibit time (tWI) can be decreased, and the time necessary for the read operation can totally be shortened.

More specifically, in the write/read of each reference data ("1" data or "0" data serving as the reference of self-reference), which is executed while the RAS signal is kept at low level, the column address number is incremented (increased) by the counter function of the column address buffer 32 from a column address that is designated first, at each of continuous falling edges of the CAS signal.

(Fourth Embodiment)

Figure 10:
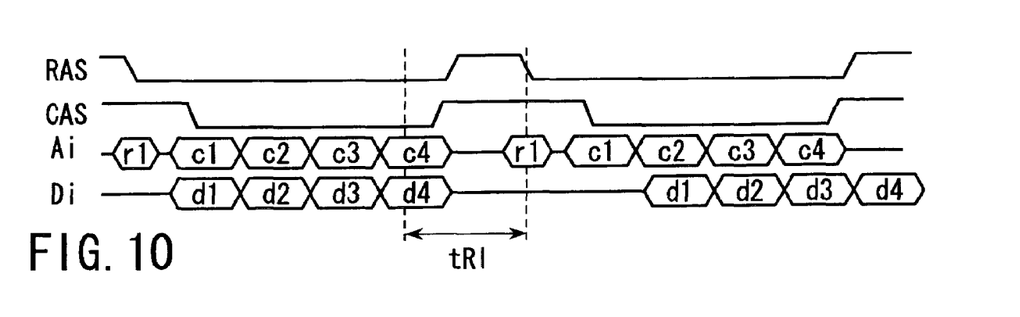
FIG. 10 is a timing chart showing an MRAM driving method according to a fourth embodiment of the present invention.

A block diagram representing an MRAM according to the fourth embodiment of the present invention is the same as that shown in FIG. 6. Even in the MRAM according to this embodiment, a read by self-reference shown in FIG. 2 is employed as a method of reading out storage data. FIG. 10 is a timing chart showing an MRAM driving method according to the fourth embodiment. As shown in FIG. 10, also in this driving method, a data read/write is executed asynchronously to an external clock.

In the driving method according to the fourth embodiment shown in FIG. 10, the read of storage data is done by self-reference for a block of a plurality of (in this case, four) bits on the same word line. That is, in this case, units of information corresponding to a plurality of addresses are continuously processed as a block. With this arrangement, the number of times of insertion of read inhibit time (tRI) and write inhibit time (tWI) can be decreased, and the time necessary for the read operation can totally be shortened.

More specifically, in the write/read of each reference data ("1" data or "0" data serving as the reference of self-reference), which is executed while the RAS signal is kept at low level, the column address generated by a control section CS2 and sent to a column address buffer 32 continuously changes while the CAS signal is set at low level. The addresses of memory cells to be continuously processed as a block may be addresses having consecutive numbers, as shown in FIG. 10, or addresses having inconsecutive numbers.

(Fifth Embodiment)

Figure 11:
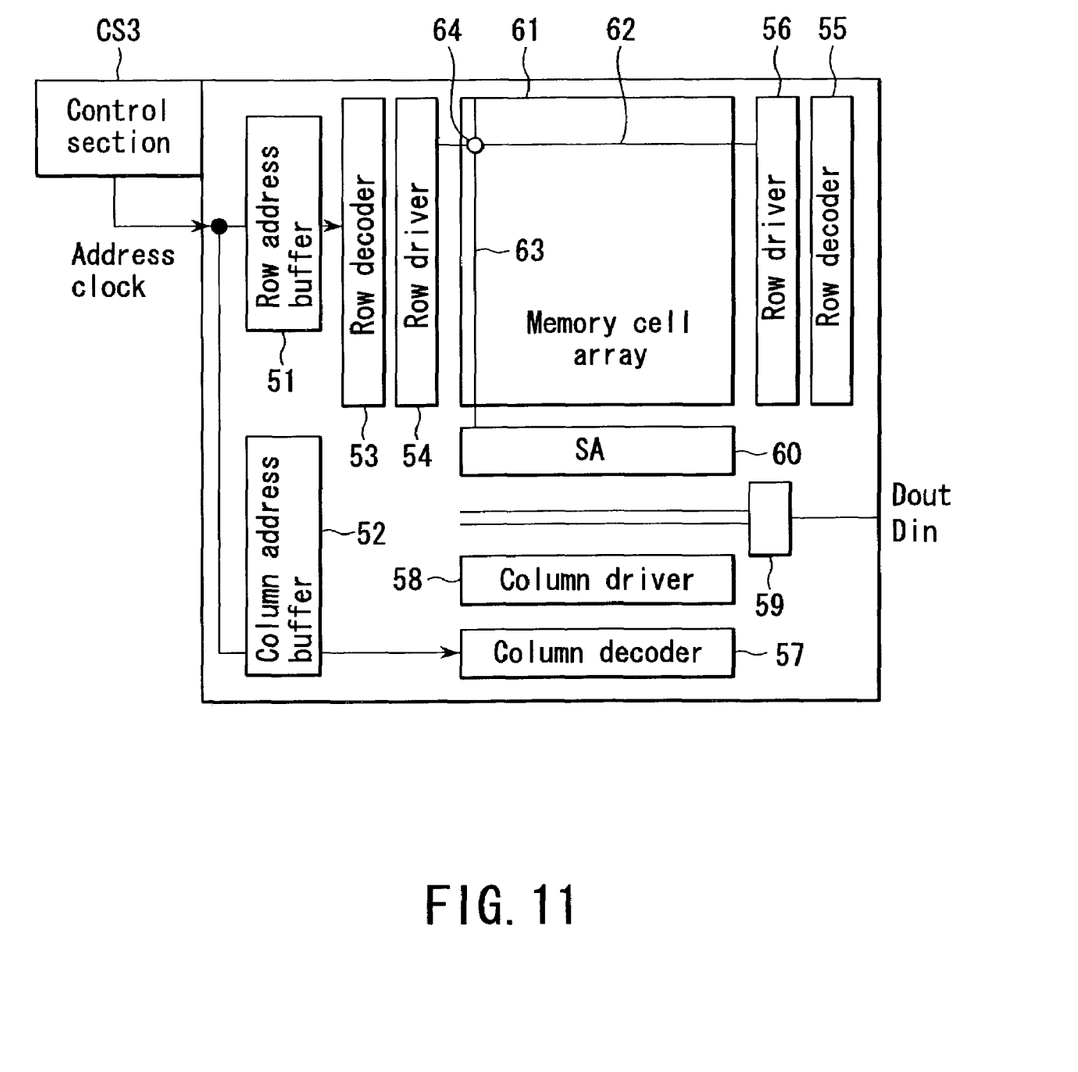
FIG. 11 is a block diagram showing an MRAM according to a fifth embodiment of the present invention.

FIG. 11 is a block diagram showing an MRAM according to the fifth embodiment of the present invention. This MRAM has a synchronous memory chip structure.

This MRAM has a memory cell array 61 in which memory cells 64 each having a magnetoresistive element as a storage element are arranged in correspondence with addresses that are arranged in a matrix format. Word lines 62 are respectively connected to the rows of the memory cell array 61. Bit lines 63 are respectively connected to the columns of the memory cell array 61. To select the word lines 62, a row address buffer 51, row decoders 53 and 55, and row drivers 54 and 56 are arranged. To select the bit lines 63, a column address buffer 52, column decoder 57, and column driver 58 are arranged. To read out storage data, a sense amplifier 59 and sub sense amplifier 60 are connected to the bit lines 63.

The row address buffer 51 and column address buffer 52 are connected to a control section CS3 which generates an address signal, data signal, and the like. The control section CS3 may be disposed on the same substrate as that of the memory cell array 61 and the like, or may be formed as an element separated from the memory cell array 61 and the like. The address signal from the control section CS3 is temporarily latched by the row address buffer 51 and column address buffer 52. In a read mode, the row decoder 53 and column decoder 57 respectively select a row and column on the basis of the latched address signal. In a write mode, a current is supplied from the column driver 58 to the bit line 63 corresponding to the address of the target memory cell 64. At the same time, a current corresponding to information to be written is supplied from the left and right row drivers 54 and 56 to the word line 62 corresponding to the address of the target memory cell 64.

Figure 12:
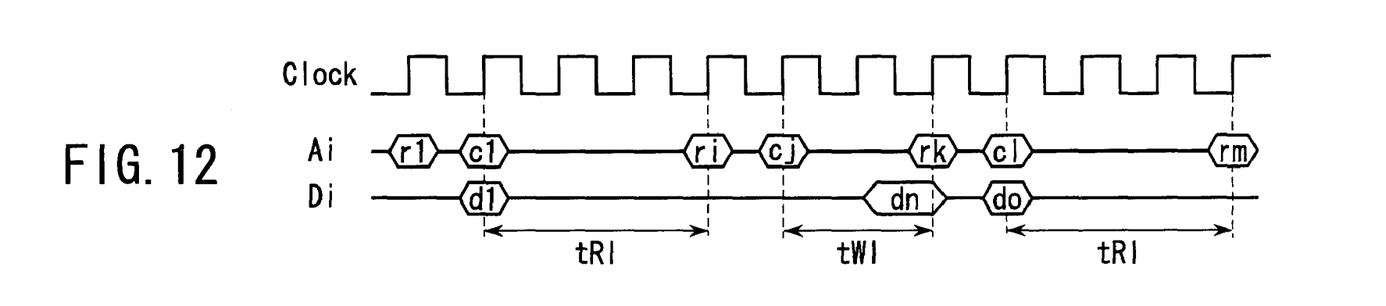
FIG. 12 is a timing chart showing an MRAM driving method according to a comparative example of the fifth embodiment.
Figure 13:
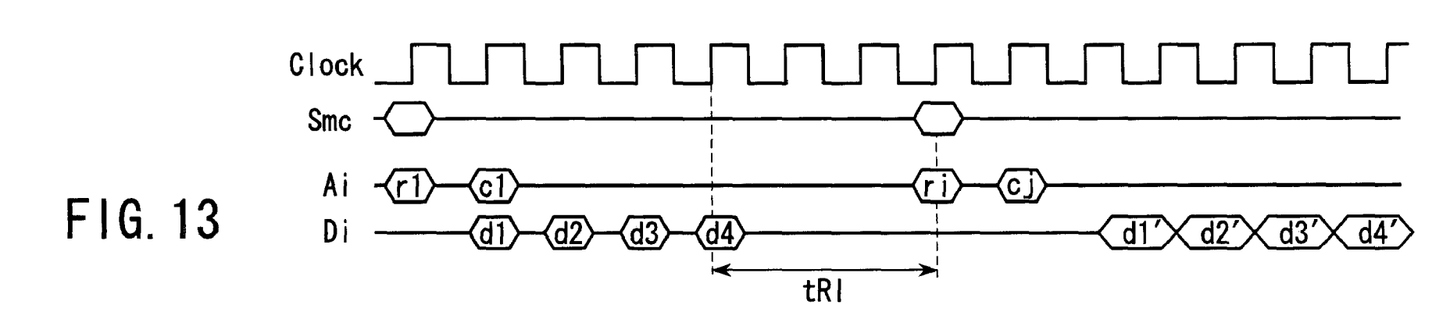
FIG. 13 is a timing chart showing an MRAM driving method according to the fifth embodiment.

FIG. 12 is a timing chart showing an MRAM driving method according to a comparative example of the fifth embodiment. FIG. 13 is a timing chart showing an MRAM driving method according to the fifth embodiment. As shown in FIGS. 12 and 13, in these driving methods, a data read/write is executed in synchronism with an external clock. Referring to FIGS. 12 and 13, tRI represents a read inhibit time, and tWI represents a write inhibit time. The read inhibit time (tRI) and write inhibit time (tWI) are inserted due to the above-described reasons.

In the driving method of the comparative example shown in FIG. 12, the data write or storage data read is executed for every bit. In this case, the write inhibit time (tWI) must be inserted before the write of each data, and the read inhibit time (tRI) must be inserted before the read of each storage data.

To the contrary, in the driving method according to the fifth embodiment shown in FIG. 13, the data write or storage data read is continuously done for a plurality of (in this case, four) bits. That is, in this case, units of information corresponding to a plurality of addresses are continuously processed as a block. In other words, the data write is set to continuously write data in a plurality of first arbitrary memory cells. The data read is set to continuously read out storage data stored in a plurality of second arbitrary memory cells. With this arrangement, the number of times of insertion of read inhibit time (tRI) and write inhibit time (tWI) can be decreased, and the time necessary for the write and read operations can totally be shortened.

More specifically, the control section CS3 generates a control signal Smc. The control signal Smc has information of the number of data to be continuously processed in each mode. In addition, each mode has a function of setting the number of bits to be continuously written or read. With this arrangement, the operation of the MRAM can be controlled. The addresses of memory cells to be continuously processed as a block may be addresses having consecutive numbers, as shown in FIG. 13, or addresses having inconsecutive numbers. Furthermore, the address at which data is to be written may be different from or the same as the address at which storage data is to be read out.

(Sixth Embodiment)

Figure 14:
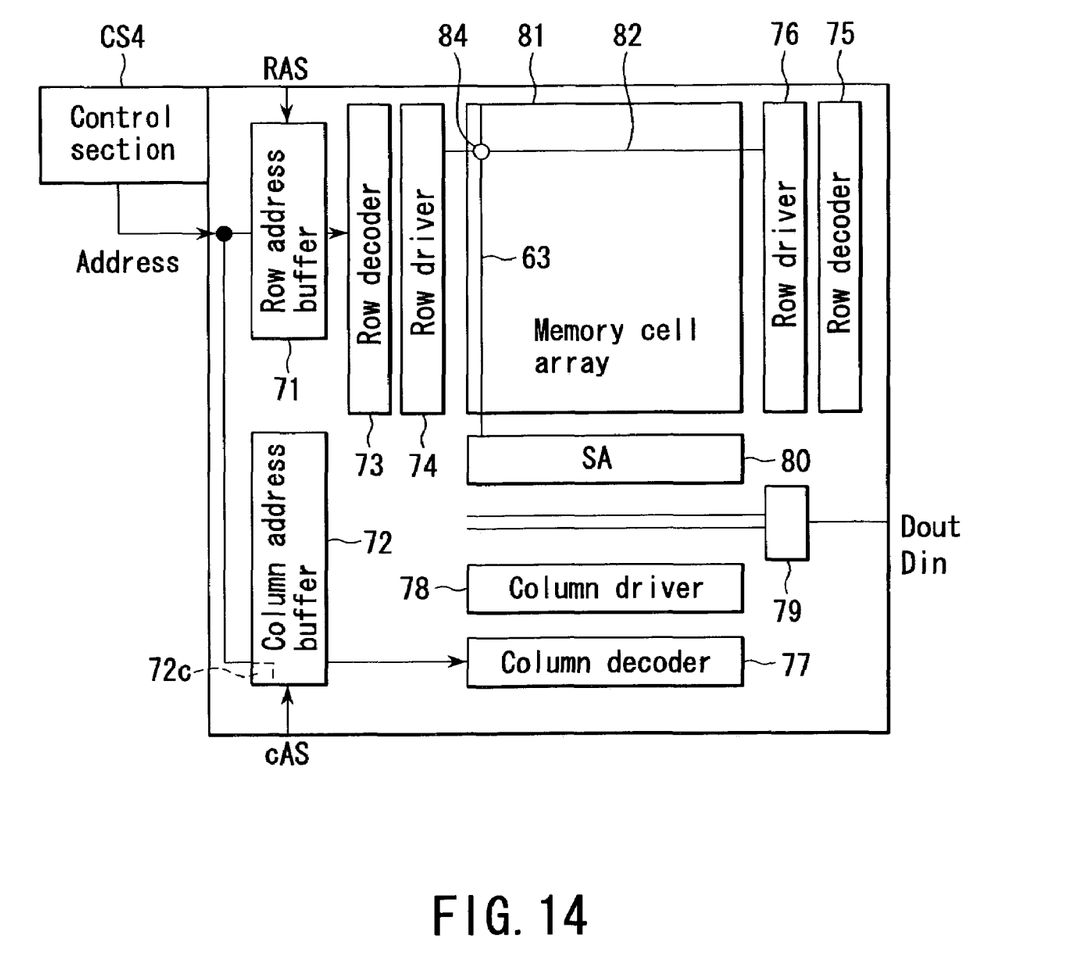
FIG. 14 is a block diagram showing an MRAM according to a sixth embodiment of the present invention.

FIG. 14 is a block diagram showing an MRAM according to the sixth embodiment of the present invention. This MRAM has an asynchronous memory chip structure.

This MRAM has a memory cell array 81 in which memory cells 84 each having a magnetoresistive element as a storage element are arranged in correspondence with addresses that are arranged in a matrix format. Word lines 82 are respectively connected to the rows of the memory cell array 81. Bit lines 83 are respectively connected to the columns of the memory cell array 81. To select the word lines 82, a row address buffer 71, row decoders 73 and 75, and row drivers 74 and 76 are arranged. To select the bit lines 83, a column address buffer 72, column decoder 77, and column driver 78 are arranged. To read out storage data, a sense amplifier 79 and sub sense amplifier 80 are connected to the bit lines 83.

The row address buffer 71 and column address buffer 72 are connected to a control section CS4 which generates a RAS (Row Address Strobe) signal, CAS (Column Address Strobe) signal, address signal, data signal, and the like. The control section CS4 may be disposed on the same substrate as that of the memory cell array 81 and the like, or may be formed as an element separated from the memory cell array 81 and the like. The address signal from the control section CS4 is latched by the row address buffer 71 in accordance with the RAS signal and also latched by the column address buffer 72 in accordance with the CAS signal. In a read mode, the row decoder 73 and column decoder 77 respectively select a row and column on the basis of the latched address signal. In a write mode, a current is supplied from the column driver 78 to the bit line 83 corresponding to the address of the target memory cell 84. At the same time, a current corresponding to information to be written is supplied from the left and right row drivers 74 and 76 to the word line 82 corresponding to the address of the target memory cell 84.

Figure 15:
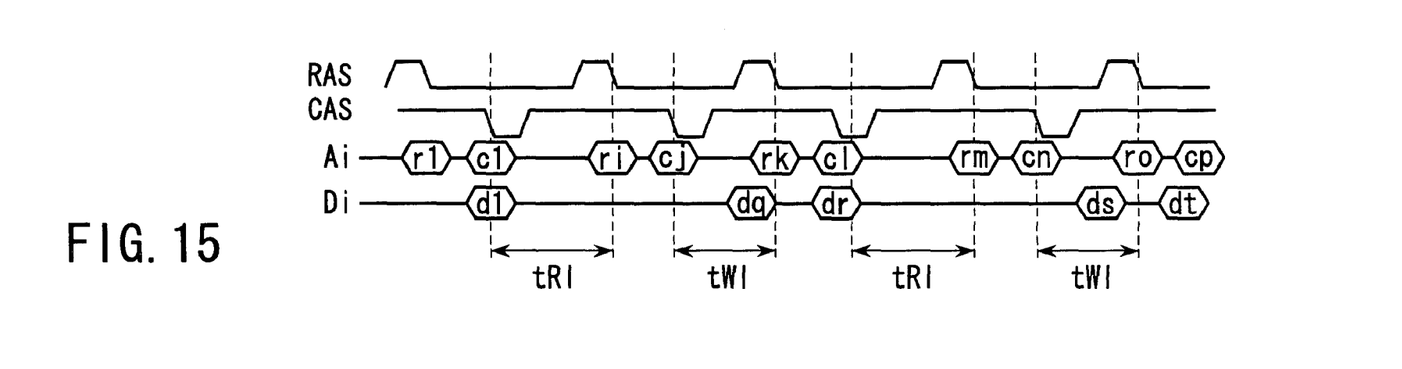
FIG. 15 is a timing chart showing an MRAM driving method according to a comparative example of the sixth embodiment.
Figure 16:
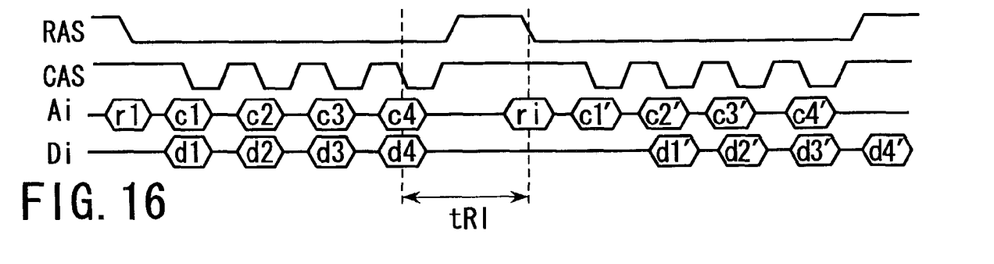
FIG. 16 is a timing chart showing an MRAM driving method according to the sixth embodiment.

FIG. 15 is a timing chart showing an MRAM driving method according to a comparative example of the sixth embodiment. FIG. 16 is a timing chart showing an MRAM driving method according to the sixth embodiment. As shown in FIGS. 15 and 16, in these driving methods, a data read/write is executed asynchronously to an external clock. Referring to FIGS. 15 and 16, tRI represents a read inhibit time, and tWI represents a write inhibit time. The read inhibit time (tRI) and write inhibit time (tWI) are inserted due to the above-described reasons.

In the driving method of the comparative example shown in FIG. 15, the data write or storage data read is executed for every bit. In this case, the write inhibit time (tWI) must be inserted before the write of each data, and the read inhibit time (tRI) must be inserted before the read of each storage data.

To the contrary, in the driving method according to the sixth embodiment shown in FIG. 16, the data write or storage data read is continuously done for a plurality of (in this case, four) bits on the same word line. With this arrangement, the number of times of insertion of read inhibit time (tRI) and write inhibit time (tWI) can be decreased, and the time necessary for the write and read operations can totally be shortened.

More specifically, in the data write or storage data read, which is executed while the RAS signal is kept at low level, each of the column addresses is received by the column address buffer 72 at each of continuous falling edges of the CAS signal. The addresses of memory cells to be continuously processed as a block may be addresses having consecutive numbers, as shown in FIG. 16, or addresses having inconsecutive numbers. Furthermore, the address at which data is to be written may be different from or the same as the address at which storage data is to be read out.

(Seventh Embodiment)

Figure 17:
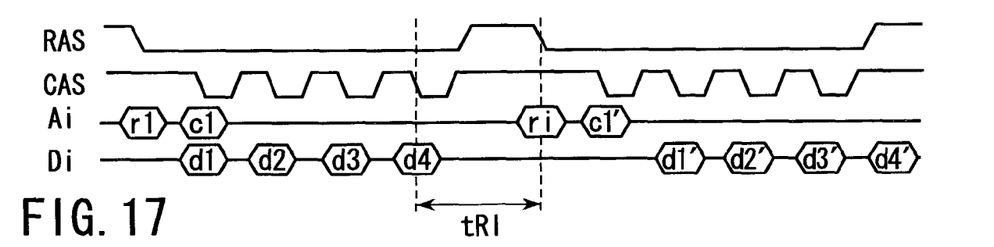
FIG. 17 is a timing chart showing an MRAM driving method according to a seventh embodiment of the present invention.

A block diagram representing an MRAM according to the seventh embodiment of the present invention is the same as that shown in FIG. 14 except a column address buffer 72 has a counter 72c which increments (increases) the column address number, as indicated by a broken line in FIG. 14. FIG. 17 is a timing chart showing an MRAM driving method according to the seventh embodiment. As shown in FIG. 17, also in this driving method, a data read/write is executed asynchronously to an external clock.

In the driving method according to the seventh embodiment shown in FIG. 17, the data write or storage data read is continuously executed for a plurality of (in this case, four) bits consecutively arranged on the same word line. That is, in this case, units of information corresponding to a plurality of addresses having consecutive numbers are continuously processed as a block. With this arrangement, the number of times of insertion of read inhibit time (tRI) and write inhibit time (tWI) can be decreased, and the time necessary for the write and read operations can totally be shortened.

More specifically, in the data write or storage data read, which is executed while the RAS signal is kept at low level, the column address number is incremented (increased) by the counter function of the column address buffer 72 from a column address that is designated first, at each of continuous falling edges of the CAS signal. Furthermore, the address at which data is to be written may be different from or the same as the address at which storage data is to be read out.

(Eighth Embodiment)

Figure 18:
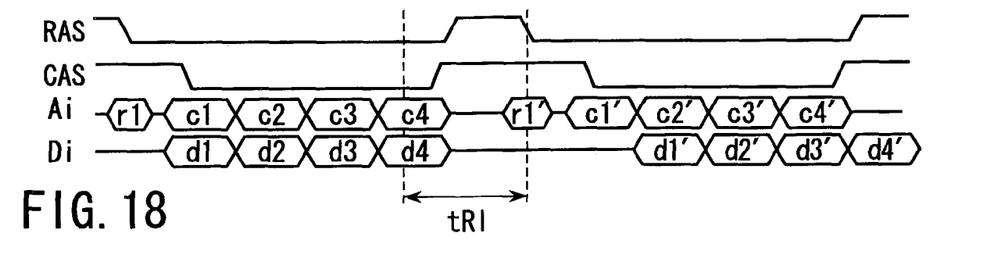
FIG. 18 is a timing chart showing an MRAM driving method according to an eighth embodiment of the present invention.

A block diagram representing an MRAM according to the eighth embodiment of the present invention is the same as that shown in FIG. 14. FIG. 18 is a timing chart showing an MRAM driving method according to the eighth embodiment. As shown in FIG. 18, also in this driving method, a data read/write is executed asynchronously to an external clock.

In the driving method according to the eighth embodiment shown in FIG. 18, the data write or storage data read is continuously executed for a plurality of (in this case, four) bits on the same word line. That is, in this case, units of information corresponding to a plurality of addresses are continuously processed as a block. With this arrangement, the number of times of insertion of read inhibit time (tRI) and write inhibit time (tWI) can be decreased, and the time necessary for the write and read operations can totally be shortened.

More specifically, in the data write or storage data read, which is executed while the RAS signal is kept at low level, the column address generated by a control section CS4 and sent to a column address buffer 72 continuously changes while the CAS signal is set at low level. The addresses of memory cells to be continuously processed as a block may be addresses having consecutive numbers, as shown in FIG. 18, or addresses having inconsecutive numbers. Furthermore, the address at which data is to be written may be different from or the same as the address at which storage data is to be read out.

According to the first to eighth embodiments of the present invention, there can be provided a magnetic random access memory and a driving method thereof, which can optimize the sequence including a write and read for a memory cell to totally shorten the necessary operation time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   a memory cell array in which memory cells, each having a magnetoresistive element as a storage element, are arranged in correspondence with addresses that are arranged in a matrix format;
   word lines respectively connected to rows of the memory cell array;
   bit lines respectively connected to columns of the memory cell array;
   a row decoder to select the word lines;
   a column decoder to select the bit lines;
   a first buffer to store detected electrical characteristic values based on storage data stored in a plurality of memory cells;
   a second buffer to store continuously detected electrical characteristic values based on reference data written in the plurality of memory cells; and
   a comparator to compare the electrical characteristic values based on the storage data with those based on the reference data to determine values of the storage data.

2. The memory according to claim 1,
   wherein first electrical characteristic values based on storage data stored in a plurality of first memory cells are detected, the reference data is continuously written in the plurality of first memory cells, the reference data written in the plurality of first memory cells is continuously read out to detect second electrical characteristic values based on the reference data, and the first electrical characteristic values based on the storage data are compared with the second electrical characteristic values these based on the reference data to determine values of the storage data.

3. The memory according to claim 2, wherein a write/read of the reference data is executed in synchronism with an external clock.

4. The memory according to claim 2, wherein a write/read of the reference data is executed asynchronously to an external clock.

5. The memory according to claim 4, further comprising a column address buffer which is connected to the column decoder and receives a column address strobe signal, wherein the write/read of the reference data is executed while causing the column address buffer to receive each of a plurality of column addresses at each of continuous falling edges of the column address strobe signal.

6. The memory according to claim 4, further comprising a column address buffer which is connected to the column decoder, has a counter function, and receives a column address strobe signal, wherein the write/read of the reference data is executed while causing the counter function to increment a column address number from a column address designated first, at each of continuous falling edges of the column address strobe signal.

7. The memory according to claim 4, further comprising a column address buffer which is connected to the column decoder and receives a column address strobe signal, wherein the write/read of the reference data is executed while changing a column address to be sent to the column address buffer while keeping the column address strobe signal at low level.

8. The memory according to claim 2, further comprising a control section which generates an address signal to be supplied to the row decoder and the column decoder.

9. The memory according to claim 1,
   wherein a data write is set to continuously write data in a plurality of first arbitrary memory cells, and a data read is set to continuously read out storage data stored in a plurality of second arbitrary memory cells.

10. The memory according to claim 9, wherein a write/read of the reference data is executed in synchronism with an external clock.

11. The memory according to claim 9, wherein a write/read of the reference data is executed asynchronously to an external clock.

12. The memory according to claim 11, further comprising a column address buffer which is connected to the column decoder and receives a column address strobe signal, wherein the write/read of the reference data is executed while causing the column address buffer to receive each of a plurality of column addresses at each of continuous falling edges of the column address strobe signal.

13. The memory according to claim 11, further comprising a column address buffer which is connected to the column decoder, has a counter function, and receives a column address strobe signal, wherein the write/read of the reference data is executed while causing the counter function to increment a column address number from a column address designated first, at each of continuous falling edges of the column address strobe signal.

14. The memory according to claim 11, further comprising a column address buffer which is connected to the column decoder and receives a column address strobe signal, wherein the write/read of the reference data is executed while changing a column address to be sent to the column address buffer while keeping the column address strobe signal at low level.

15. The memory according to claim 9, further comprising a control section which generates an address signal to be supplied to the row decoder and the column decoder.

16. The memory according to claim 1, further comprising a column address buffer which is connected to the column decoder and receives a column address strobe signal.

17. The memory according to claim 16, the column address buffer has a counter function.

18. The memory according to claim 1, further comprising a control section which generates an address signal to be supplied to the row decoder and the column decoder.

19. A magnetic random access memory comprising:
a memory cell array in which memory cells, each having a magnetoresistive element as a storage element, are arranged in correspondence with addresses that are arranged in a matrix format;
word lines respectively connected to rows of the memory cell array;
bit lines respectively connected to columns of the memory cell array;
a row decoder to select the word lines;
a column decoder to select the bit lines; and
a setting section to set a data write to continuously write data in a plurality of first arbitrary memory cells, and set a data read to continuously read out storage data stored in a plurality of second arbitrary memory cells, further comprising a column address buffer which is connected to the column decoder and receives a column address strobe signal.

20. The memory according to claim 19, the column address buffer has a counter function.

21. The memory according to claim 19, further comprising a control section which generates an address signal to be supplied to the row decoder and the column decoder.

22. A driving method of a magnetic random access memory which comprises:
a memory cell array in which memory cells, each having a magnetoresistive element as a storage element, are arranged in correspondence with addresses that are arranged in a matrix format,
word lines respectively connected to rows of the memory cell array,
bit lines respectively connected to columns of the memory cell array,
a row decoder to select the word lines, and
a column decoder to select the bit lines,
the method comprising:
detecting electrical characteristic values based on storage data stored in a plurality of memory cells;
continuously writing reference data in the plurality of memory cells;
continuously reading out the reference data written in the plurality of memory cells to detect electrical characteristic values based on the reference data; and
comparing the electrical characteristic values based on the storage data with those based on the reference data to determine values of the storage data, wherein a write/read of the reference data is executed in synchronism with an external clock.

23. A driving method of a magnetic random access memory which comprises:
a memory cell array in which memory cells, each having a magnetoresistive element as a storage element, are arranged in correspondence with addresses that are arranged in a matrix format,
word lines respectively connected to rows of the memory cell array,
bit lines respectively connected to columns of the memory cell array,
a row decoder to select the word lines, and
a column decoder to select the bit lines,
the method comprising:
detecting electrical characteristic values based on storage data stored in a plurality of memory cells;
continuously writing reference data in the plurality of memory cells;
continuously reading out the reference data written in the plurality of memory cells to detect electrical characteristic values based on the reference data; and
comparing the electrical characteristic values based on the storage data with those based on the reference data to determine values of the storage data, wherein a write/read of the reference data is executed asynchronously to an external clock.

24. The method according to claim 23, wherein
the magnetic random access memory further comprises a column address buffer which is connected to the column decoder and receives a column address strobe signal, and
in the method, the write/read of the reference data is executed while causing the column address buffer to receive each of a plurality of column addresses at each of continuous falling edges of the column address strobe signal.

25. The method according to claim 23, wherein
the magnetic random access memory further comprises a column address buffer which is connected to the column decoder, has a counter function, and receives a column address strobe signal, and
in the method, the write/read of the reference data is executed while causing the counter function to increment a column address number from a column address designated first, at each of continuous falling edges of the column address strobe signal.

26. The method according to claim 23, wherein
the magnetic random access memory further comprises a column address buffer which is connected to the column decoder and receives a column address strobe signal, and
in the method, the write/read of the reference data is executed while changing a column address to be sent to the column address buffer while keeping the column address strobe signal at low level.

27. A driving method of a magnetic random access memory which comprises:
a memory cell array in which memory cells, each having a magnetoresistive element as a storage element, are arranged in correspondence with addresses that are arranged in a matrix format,
word lines respectively connected to rows of the memory cell array,
bit lines respectively connected to columns of the memory cell array,
a row decoder to select the word lines, and
a column decoder to select the bit lines,
the method comprising:
executing a data write which is set to continuously write data in a plurality of first arbitrary memory cells; and
executing a data read which is set to continuously read out storage data stored in a plurality of second arbitrary memory cells, wherein a write/read of the reference data is executed in synchronism with an external clock.

28. A driving method of a magnetic random access memory which comprises:
a memory cell array in which memory cells, each having a magnetoresistive element as a storage element, are arranged in correspondence with addresses that are arranged in a matrix format,
word lines respectively connected to rows of the memory cell array,
bit lines respectively connected to columns of the memory cell array,
a row decoder to select the word lines, and
a column decoder to select the bit lines,
the method comprising:
executing a data write which is set to continuously write data in a plurality of first arbitrary memory cells; and
executing a data read which is set to continuously read out storage data stored in a plurality of second arbitrary memory cells, wherein a write/read of the reference data is executed asynchronously to an external clock.

29. The method according to claim 28, wherein
the magnetic random access memory further comprises a column address buffer which is connected to the column decoder and receives a column address strobe signal, and
in the method, the write/read of the reference data is executed while causing the column address buffer to receive each of a plurality of column addresses at each of continuous falling edges of the column address strobe signal.

30. The method according to claim 28, wherein
the magnetic random access memory further comprises a column address buffer which is connected to the column decoder, has a counter function, and receives a column address strobe signal, and
in the method, the write/read of the reference data is executed while causing the counter function to increase a column address number from a column address designated first, at each of continuous falling edges of the column address strobe signal.

31. The method according to claim 28, wherein
the magnetic random access memory further comprises a column address buffer which is connected to the column decoder and receives a column address strobe signal, and
in the method, the write/read of the reference data is executed while changing a column address to be sent to the column address buffer while keeping the column address strobe signal at low level.

* * * * *